US010435818B2

(12) United States Patent
Wang

(10) Patent No.: US 10,435,818 B2
(45) Date of Patent: Oct. 8, 2019

(54) FLEXIBLE SUBSTRATE OF BENDABLE DISPLAY DEVICE AND MANUFACTURING METHOD THEREOF

(71) Applicant: BOE TECHNOLOGY GROUP CO., LTD., Beijing (CN)

(72) Inventor: Tao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 447 days.

(21) Appl. No.: 15/215,819

(22) Filed: Jul. 21, 2016

(65) Prior Publication Data
US 2017/0223821 A1 Aug. 3, 2017

(30) Foreign Application Priority Data
Feb. 2, 2016 (CN) .......................... 2016 1 0073751

(51) Int. Cl.
H05K 1/02 (2006.01)
D01D 5/00 (2006.01)
H05K 3/00 (2006.01)
G06F 1/16 (2006.01)
G09F 9/30 (2006.01)

(52) U.S. Cl.
CPC ......... *D01D 5/0084* (2013.01); *G06F 1/1652* (2013.01); *G09F 9/301* (2013.01); *H05K 1/0281* (2013.01)

(58) Field of Classification Search
CPC ..... G06F 1/1652; G09F 9/301; H05K 1/0281; D01D 5/0084
See application file for complete search history.

(56) References Cited

FOREIGN PATENT DOCUMENTS

| CN | 103531724 A | 1/2014 | | |
|---|---|---|---|---|
| CN | 204257710 U | * | 4/2015 | |
| CN | 204257710 U | | 4/2015 | |
| CN | 105074802 A | * | 11/2015 | ......... H01L 51/0097 |

(Continued)

OTHER PUBLICATIONS

[NPL-1] Xiangtian (CN-105074802-A); Nov. 2015 (EPO—machine translation to English). (Year: 2015).*

(Continued)

*Primary Examiner* — David Sample
*Assistant Examiner* — Donald M Flores, Jr.
(74) *Attorney, Agent, or Firm* — Nath, Goldberg & Meyer; Joshua B. Goldberg

(57) ABSTRACT

The present disclosure provides a flexible substrate of a bendable display device and a manufacturing method thereof, the flexible substrate includes a bendable base layer, which includes a bending region and a non-bending region; the flexible substrate further includes a fiber reinforced layer, which is provided on a surface of the base layer and has different distribution densities in the bending region and the non-bending region. The flexible substrate of a bendable display device provided in the present disclosure can not only protect semiconductor devices on the flexible substrate, and avoid situations such as dislocation of circuits of electronic components, low yield rate and etc., but can also disperse bending stress generated when the flexible substrate is bent, thereby prolonging the bending life of the display device.

9 Claims, 3 Drawing Sheets

(56) References Cited

FOREIGN PATENT DOCUMENTS

| | | | |
|---|---|---|---|
| CN | 105074802 | A | 11/2015 |
| EP | 2178133 | A3 | 12/2013 |

OTHER PUBLICATIONS

[NPL-2] Wei (CN-204257710-U); Apr. 2015 (EPO—machine translation to English). (Year: 2015).*
First Office Action dated Mar. 20, 2018 corresponding to Chinese application No. 201610073751.5.

* cited by examiner

FLEXIBLE SUBSTRATE OF BENDABLE DISPLAY DEVICE AND MANUFACTURING METHOD THEREOF

FIELD OF THE DISCLOSURE

The present disclosure relates to the field of display technology, and particularly, to a flexible substrate of a bendable display device and a manufacturing method thereof.

BACKGROUND OF THE DISCLOSURE

At present, bendable display can be realized by a liquid crystal display (LCD) and an organic light emitting diode (OLED) display panel. Benefiting from a characteristic of self-luminescence, the OLED display panel which is prepared on a flexible substrate is more likely to realize bendable display with a smaller bending radius. Therefore, manufacturing of an OLED display panel comprising a flexible substrate has drawn extensive attention.

However, for a bendable display device, an existing flexible substrate may have slight deformation when being bent, which causes adverse effects such as dislocation of circuits of electronic components and low yield rate, and further results in increased cost of the flexible display device. Moreover, the existing flexible substrate will generate a bending stress when being bent, which influences bending life of the display device.

SUMMARY

In order to address at least one of the technical problems existing in the prior art, the present disclosure provides a flexible substrate of a bendable display device and a manufacturing method thereof, which can not only protect semiconductor devices on the flexible substrate, and avoid situations such as dislocation of circuits of electronic components, low rate of qualified products and etc., but can also disperse bending stress generated when the flexible substrate is bent, thereby prolonging the bending life of the display device.

In order to achieve the object of the present disclosure, the embodiments of the present disclosure provides a flexible substrate of a bendable display device, comprising a bendable base layer, which includes a bending region and a non-bending region as well as a fiber reinforced layer, and the fiber reinforced layer is provided on a surface of the base layer and has different distribution densities at the bending region and the non-bending region.

Optionally, the base layer further includes a boundary region, which is located between the bending region and the non-bending region; the fiber reinforced layer is also distributed in the boundary region, and the distribution density of fibers of the fiber reinforced layer distributed in the boundary region is larger than the distribution density of fibers of the fiber reinforced layer distributed in the bending region and/or the non-bending region.

Optionally, the fiber reinforced layer includes first linear fibers, which are distributed in the bending region and the boundary region respectively, and the distribution density of the first linear fibers distributed in the boundary region is larger than the distribution density of the first linear fibers distributed in the bending region.

Optionally, the fiber reinforced layer further includes second linear fibers, the second linear fibers intersect the first linear fibers, and an intersection angle formed between the second linear fibers and the first linear fibers is smaller than or equal to 90 degrees; the second linear fibers are distributed at uniform intervals in the bending region, the boundary region and the non-bending region.

Optionally, the fiber reinforced layer includes first linear fibers, which are distributed in the non-bending region and the boundary region respectively, and the distribution density of the first linear fibers distributed in the boundary region is larger than the distribution density of the first linear fibers distributed in the non-bending region.

Optionally, the fiber reinforced layer further includes second linear fibers, the second linear fibers intersect the first linear fibers, and an intersection angle formed between the second linear fibers and the first linear fibers is smaller than or equal to 90 degrees; the second linear fibers are distributed at uniform intervals in the bending region, the boundary region and the non-bending region.

Optionally, an area of the boundary region is 5% to 15% of an area of the bending region.

Optionally, the base layer includes a single layer; or, the base layer includes a plurality of layers, and a surface of at least one of the plurality of layers of the base layer is provided thereon with the fiber reinforced layer.

As another technical solution, the present disclosure further provides a manufacturing method of a flexible substrate of a bendable display device, comprising steps of:

fixing monomers of polymer on a rigid substrate and curing the monomers of polymer to form a bendable base layer; the base layer including a bending region and a non-bending region; and spinning on a surface of the base layer to form a fiber reinforced layer, the fiber reinforced layer being distributed in the bending region and/or the non-bending region based on different bending conditions of the base layer.

Optionally, an electrospinning polymerization method is employed to perform spinning on the surface of the base layer; or, a method of stereospecific polymerization in electric field and magnetic field is employed to perform spinning on the surface of the base layer.

DETAILED DESCRIPTION OF THE EMBODIMENTS

To make those skilled in the art better understand the technical solutions of the present disclosure, a flexible substrate of a bendable display device and a manufacturing method thereof provided in the present disclosure will be described in detail below in conjunction with the accompanying drawings.

Figure 1:
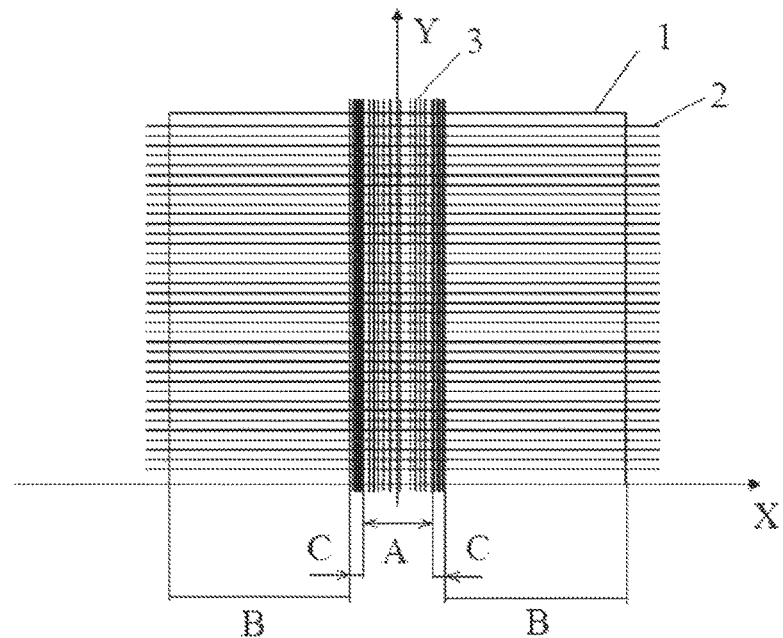
FIG. 1 is a schematic diagram of distribution of fibers of a fiber reinforced layer of a flexible substrate of a bendable display device provided in a first embodiment of the present disclosure.

FIG. 1 is a schematic diagram of distribution of fibers of a fiber reinforced layer of a flexible substrate of a bendable display device provided in a first embodiment of the present disclosure. Referring to FIG. 1, the flexible substrate includes a bendable base layer 1, the bendable base layer 1 includes a bending region A, a non-bending region B and a boundary region C, and the boundary region C is located between the bending region A and the non-bending region B. A part of the base layer 1 corresponding to the bending region A is bendable, whereas a part of the base layer 1 corresponding to the non-bending region B is inflexible.

Further, a fiber reinforced layer is provided on a surface of the base layer 1, and the fiber reinforced layer is distributed in the bending region A, the non-bending region B and the boundary region C respectively, to increase rigidity of respective regions of the base layer 1, thereby protecting semiconductor devices on the flexible substrate, and avoiding situations such as dislocation of circuits of electronic components, low yield rate and the like when the base layer 1 is bent.

Specifically, the fiber reinforced layer includes first linear fibers 3 and second linear fibers 2. The first linear fibers 3 are parallel to Y axis in FIG. 1 and distributed in the bending region A and the boundary region C respectively, and the distribution density of the first linear fibers 3 distributed in the boundary region C is larger than that distributed in the bending region A, which can play a role of dispersing bending stress generated when the flexible substrate is bent, and thus prolong the bending life of the display device.

The second linear fibers 2 intersect the first linear fibers 3, and an intersection angle formed therebetween is equal to 90 degrees, that is, the second linear fibers 2 are parallel to X axis in FIG. 1, and distributed at uniform intervals in the bending region A, the boundary region C and the non-bending region B. The second linear fibers 2 are used for further increasing rigidity of the parts of the base layer 1 corresponding to the bending region A, the boundary region C and the non-bending region B in a uniform way. In practical use, an intersection angle between the second linear fibers 2 and the first linear fibers 3, which is not particularly limited in the present application, may be set to be smaller than 90 degrees according to specific needs. In addition, the second linear fibers 2 can be selectively provided in at least one of the bending region A, the boundary region C and the non-bending region B, in other words, the second linear fibers 2 may not be provided in the bending region A, the boundary region C or the non-bending region B.

Figure 2:
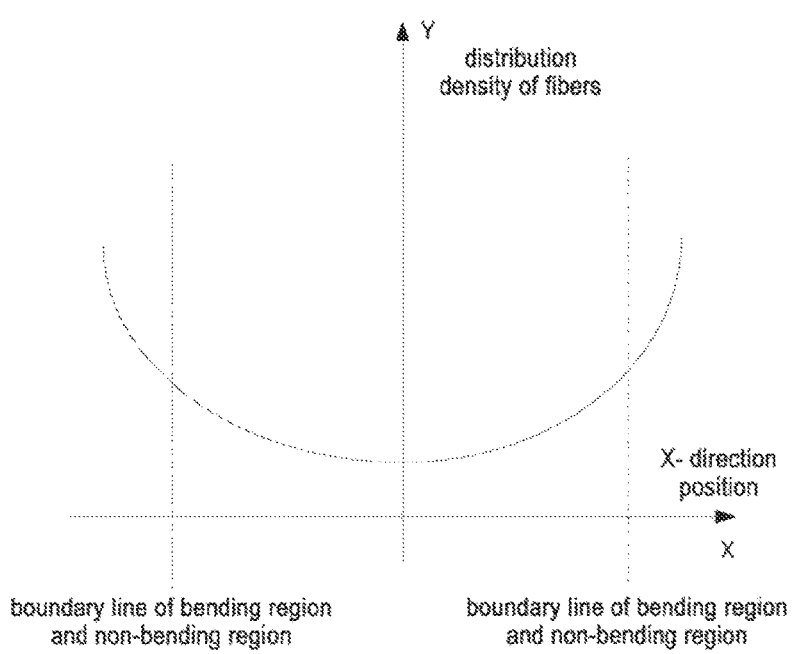
FIG. 2 is a graph of distribution density of fibers of the fiber reinforced layer in FIG. 1.

According to the bending requirements, the distribution density of fibers of the fiber reinforced layer distributed in the boundary region C is larger than those distributed in the bending region A and the non-bending region B; the distribution density of fibers of the fiber reinforced layer distributed in the bending region A is larger than that distributed in the non-bending region B, so as to effectively disperse the bending stress generated in the part of the base layer 1 corresponding to the boundary region C. For example, FIG. 2 is a graph of distribution density of fibers of the fiber reinforced layer in FIG. 1. As shown in FIG. 2, a broken line is a boundary line S of the bending region A or the non-bending region B; the Y axis denotes distribution density M of fibers. In the present embodiment, the distribution density of the first linear fibers 3 decreases gradually from both sides to the middle by taking a line of "X=0" as the axis of symmetry and shows a parabolic distribution. In practical use, the distribution density of fibers can be designed according to different bending requirements. For example, the distribution density of the first linear fibers 3 can also show an exponential distribution or other curve distributions.

Optionally, an area of the boundary region C is 5% to 15% of an area of the bending region A, and the bending stress generated in the part of the base layer 1 corresponding to the boundary region C can be effectively dispersed by increasing the distribution density of fibers in the boundary region C.

It should be noted that, in practical use, the base layer 1 can include a single layer; or, the base layer 1 can include a plurality of layers, and for the one base layer 1 including the plurality of base layers, a surface of at least one layer of the base layer 1 is provided thereon with the fiber reinforced layer according to the bending requirements.

It should be also noted that, in the present embodiment, the fiber reinforced layer is distributed in the bending region A, the boundary region C and the non-bending region B respectively, but the present disclosure is not limited thereto. In practical use, the fiber reinforced layer is distributed in at least one of the bending region A, the non-bending region B and the boundary region C based on different bending conditions of the base layer 1. Or, the boundary region C may be omitted, and the fiber reinforced layer is distributed in the bending region A and/or the non-bending region B.

Figure 3:
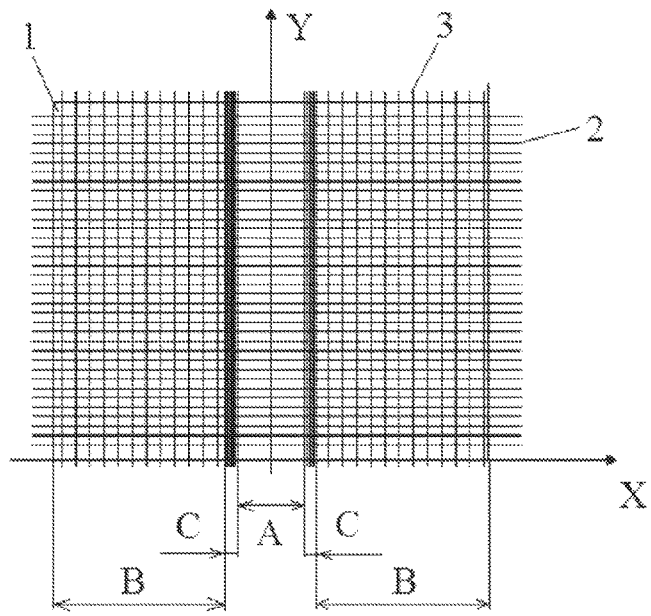
FIG. 3 is a schematic diagram of distribution of fibers of a fiber reinforced layer of a flexible substrate of a bendable display device provided in a second embodiment of the present disclosure.

FIG. 3 is a schematic diagram of distribution of fibers of a fiber reinforced layer of a flexible substrate of a bendable display device provided in a second embodiment of the present disclosure. Referring to FIG. 3, the only difference between the flexible substrate of the bendable display device provided in the present embodiment and the aforesaid first embodiment lies in that: the distribution mode and distribution density of the first linear fibers are different.

Figure 4:
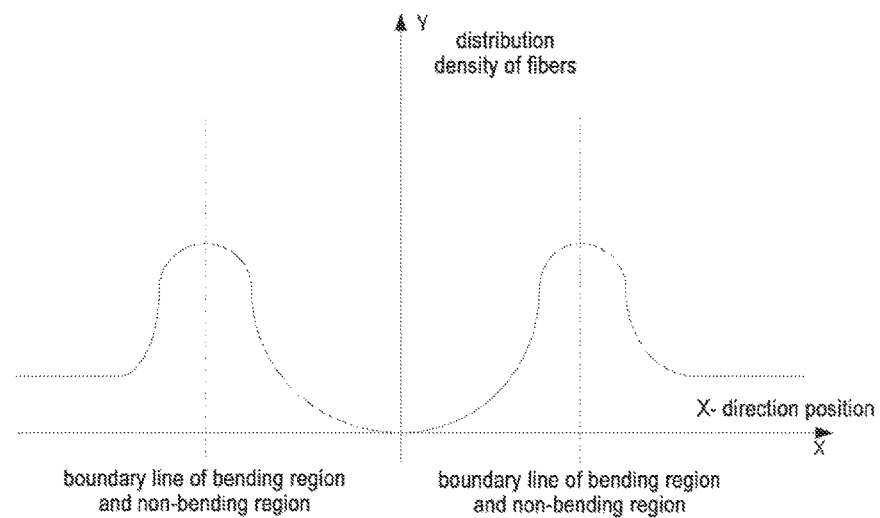
FIG. 4 is a graph of distribution density of fibers of the fiber reinforced layer in FIG. 3.

Specifically, in the present embodiment, the first linear fibers 3 are parallel to the Y axis in FIG. 1 and distributed in the non-bending region B and the boundary region C respectively, whereas there is no first linear fiber 3 distributed in the bending region A in order to reduce rigidity of the part of the base layer 1 corresponding to the bending region A, thereby improving the bendability of the bending region A. Moreover, FIG. 4 is a graph of distribution density of fibers of the fiber reinforced layer in FIG. 3. As shown in FIG. 4, the broken line is the boundary line S of the bending region A or the non-bending region B; the Y axis denotes the distribution density M of fibers. The distribution density of the first linear fibers 3 distributed in the boundary region C is larger than that distributed in the non-bending region B, which plays a role of dispersing the bending stress generated when the flexible substrate is bent, and thus can prolong the bending life of the display device.

The second linear fibers 2 intersect the first linear fibers 3, and an intersection angle formed therebetween is equal to 90 degrees, that is, the second linear fibers 2 are parallel to X axis in FIG. 1, and the second linear fibers 2 are distributed at uniform intervals in the bending region A, the boundary region C and the non-bending region B. The second linear fibers 2 are used for further increasing rigidity of the parts of the base layer 1 corresponding to the bending region A, the boundary region C and the non-bending region B in a uniform way. In practical use, an intersection angle between the second linear fibers 2 and the first linear fibers 3, which is not particularly limited in the present application, can be set to be smaller than 90 degrees according to specific needs. In addition, the second linear fibers 2 can be selectively provided in at least one of the bending region A, the boundary region C and the non-bending region B, in other words, the second linear fibers 2 may not be provided in the bending region A, the boundary region C or the non-bending region B.

Figure 5:
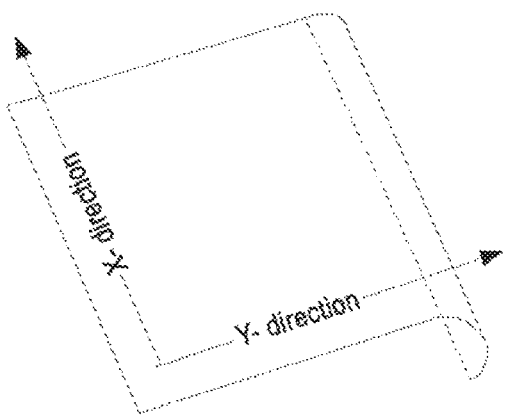
FIG. 5 is a schematic structural diagram of a flexible substrate of a bendable display device provided in a third embodiment of the present disclosure.
Figure 6:
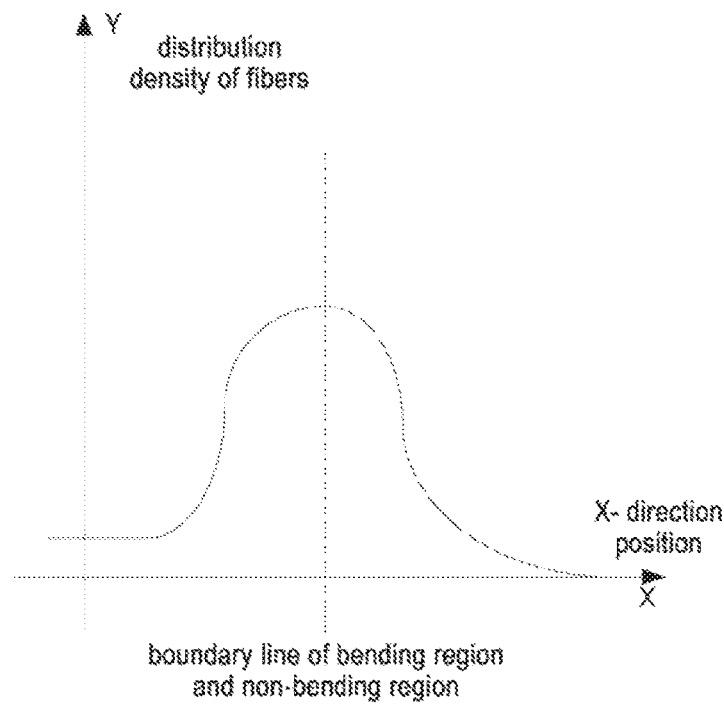
FIG. 6 is a graph of distribution density of fibers of the fiber reinforced layer in FIG. 5.

In practical use, the flexible substrate can be in a bending mode that the flexible substrate restores after bent, or in a bending mode that the flexible substrate is bent into a fixed shape, namely, after bent into a fixed shape, the flexible substrate does not restore to a plane state. For example, FIG. 5 is a schematic structural diagram of a flexible substrate of a bendable display device provided in a third embodiment of the present disclosure. As shown in FIG. 5, the base layer 1 includes the bending region A and the non-bending region B, wherein, after a part of the base layer 1 corresponding to the bending region A is bent into a fixed shape, the flexible substrate does not restore to a plane state. In this case, FIG. 6 is a graph of distribution density of fibers of the fiber reinforced layer in FIG. 5. As shown in FIG. 6, the broken line is the boundary line S of the bending region A or the non-bending region B; the Y axis denotes the distribution density M of fibers. Along the X direction, the fiber reinforced layer can be provided in the bending region A and the boundary region C respectively, so as to achieve an effect of dispersing bending stress generated when the flexible substrate is bent, thereby prolonging the bending life of the display device.

In summary, in the flexible substrate of the bendable display device provided in each of the above embodiments of the present disclosure, the fiber reinforced layer is provided on the surface of the base layer and is distributed in the bending region and/or the non-bending region based on different bending conditions of the base layer, which can not only protect semiconductor devices on the flexible substrate, and avoid situations such as dislocation of circuits of electronic components, low yield rate and etc., but can also disperse bending stress generated when the flexible substrate is bent, thereby prolonging the bending life of the display device.

Figure 7:
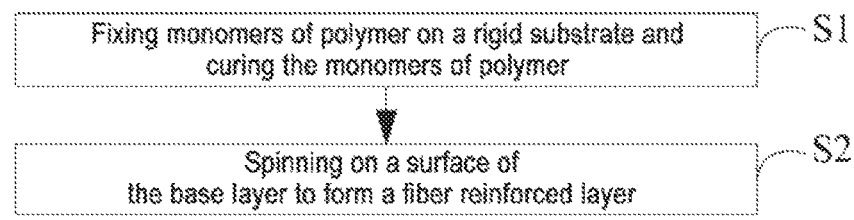
FIG. 7 is a flowchart of a manufacturing method of a flexible substrate of a bendable display device provided in the present disclosure.

As another technical solution, FIG. 7 is a flowchart of a manufacturing method of a flexible substrate of a bendable display device provided in the present disclosure. Referring to FIG. 7, a manufacturing method of a flexible substrate of a bendable display device includes the following steps:

S1, fixing monomers of polymer on a rigid substrate and curing the monomers of polymer to form a bendable base layer; the base layer including a bending region and a non-bending region;

S2, spinning on a surface of the base layer to form a fiber reinforced layer, the fiber reinforced layer being distributed in the bending region and/or the non-bending region based on different bending conditions of the base layer.

In step S1, the rigid substrate can be made of a material such as glass or metal, and the bendable base layer can be formed in a sheet to sheet manner, or in a roll to roll manner. In the present embodiment, the sheet to sheet manner is taken as an example, the monomers of polymer are fixed on the rigid substrate by a coating method (such as spin coating, slot die coating and etc.), and different curing methods can be employed to perform curing process on the monomers of polymer on the rigid substrate according to the rigid substrates made of different materials. In addition, the curing degree and the curing rate can be controlled in accordance with the actual curing conditions.

In step S2, a method of electrospinning polymerization can be employed to perform spinning on the surface of the base layer; or, a method of stereospecific polymerization in electric field and magnetic field can be employed to perform spinning on the surface of the base layer. The position, pattern and number of layers of the fiber reinforced layer can be designed correspondingly according to different bending requirements. Specifically, take the bendable base layer formed in a sheet to sheet manner for an example, the monomers of polymer are fixed on the rigid substrate by a coating method, and when the curing degree of the material of the monomers of polymer reaches 60% or higher (or at least in viscous flow state), spinning is performed on the surface of the substrate through a electrospinning method or a method of stereospecific polymerization in electric field.

In addition, a display device is provided on the base layer, the display device usually includes a TFT device, an organic light emitting material layer and a packaging protection layer, wherein, the TFT device is provided on the base layer; the organic light emitting material layer is provided on the TFT device; and the packaging protection layer is provided on the organic light emitting material layer. Certainly, in practical use, the display device can include other kinds of film layers according to specific requirements.

In summary, in the manufacturing method of the flexible substrate of the bendable display device provided in the embodiment of the present disclosure, spinning is performed on the surface of the base layer to form the fiber reinforced layer which is distributed in the bending region and/or the non-bending region based on different bending conditions of the base layer, which can not only protect semiconductor devices on the flexible substrate, and avoid situations such as dislocation of circuits of electronic components, low yield rate and etc., but can also disperse bending stress generated when the flexible substrate is bent, thereby prolonging the bending life of the display device.

It should be understood that the above embodiments are merely exemplary embodiments adopted for describing the principle of the present disclosure, but the present disclosure is not limited thereto. Various modifications and improvements may be made by those skilled in the art without departing from the spirit and essence of the present disclosure, and these modifications and improvements also fall into the protection scope of the present disclosure.

The invention claimed is:

1. A flexible substrate of a bendable display device, comprising a bendable base layer, which comprises a bending region and a non-bending region, wherein, the flexible substrate further comprises a fiber reinforced layer, which is provided on a surface of the base layer, and wherein, a distribution density of fibers of the fiber reinforced layer in the bending region is different from a distribution density of fibers of the fiber reinforced layer in the non-bending region,
    the base layer further comprises a boundary region, which is located between the bending region and the non-bending region; and
    the fiber reinforced layer is also distributed in the boundary region, and a distribution density of fibers of the fiber reinforced layer in the boundary region is larger than a distribution density of fibers of the fiber reinforced layer in the bending region.

2. The flexible substrate of a bendable display device according to claim 1, wherein,
    the fiber reinforced layer comprises first linear fibers, which are distributed in the bending region and the boundary region respectively, and the distribution density of the first linear fibers in the boundary region is larger than the distribution density of the first linear fibers in the bending region.

3. The flexible substrate of a bendable display device according to claim 2, wherein, the fiber reinforced layer further comprises second linear fibers, the second linear fibers intersect the first linear fibers, and an intersection angle formed between the second linear fibers and the first linear fibers is smaller than or equal to 90 degrees; and the second linear fibers are distributed at uniform intervals in the bending region, the boundary region and the non-bending region.

4. The flexible substrate of a bendable display device according to claim 1, wherein, the fiber reinforced layer comprises first linear fibers, which are distributed in the non-bending region and the boundary region respectively, and the distribution density of the first linear fibers distributed in the boundary region is larger than the distribution density of the first linear fibers distributed in the non-bending region.

5. The flexible substrate of a bendable display device according to claim 4, wherein, the fiber reinforced layer further comprises second linear fibers, the second linear fibers intersect the first linear fibers, and an intersection angle formed between the second linear fibers and the first linear fibers is smaller than or equal to 90 degrees; and the second linear fibers are distributed at uniform intervals in the bending region, the boundary region and the non-bending region.

6. The flexible substrate of a bendable display device according to claim 1, wherein, an area of the boundary region is 5% to 15% of an area of the bending region.

7. The flexible substrate of a bendable display device according to claim 1, wherein, the base layer comprises a single layer; or, the base layer comprises a plurality of layers, and a surface of at least one of the plurality of layers of the base layer is provided thereon with the fiber reinforced layer.

8. A manufacturing method of a flexible substrate of a bendable display device, comprising steps of:

fixing monomers of polymer on a rigid substrate and curing the monomers of polymer to form a bendable base layer; the base layer including a bending region and a non-bending region; and spinning on a surface of the base layer to form a fiber reinforced layer, wherein, a distribution density of fibers of the fiber reinforced layer in the bending region is different from a distribution density of fibers of the fiber reinforced layer in the non-bending region, the base layer further comprises a boundary region, which is located between the bending region and the non-bending region; and the fiber reinforced layer is also distributed in the boundary region, and a distribution density of fibers of the fiber reinforced layer in the boundary region is larger than a distribution density of fibers of the fiber reinforced layer in the bending region.

9. The manufacturing method of the flexible substrate of a bendable display device according to claim 8, wherein, the step of spinning on a surface of the base layer to form a fiber reinforced layer comprises:

spinning on the surface of the base layer through an electrospinning polymerization method; or, spinning on the surface of the base layer through a method of stereospecific polymerization in electric field and magnetic field.

* * * * *